United States Patent [19]

Roback et al.

[11] 4,039,900

[45] Aug. 2, 1977

[54] PLUG IN REGULATING POWER SUPPLY

[75] Inventors: Donald W. Roback, New Brighton; Wilbur J. Hampel, Wayzata; Luther T. Prince, Minneapolis; Dean L. Huppert, Edina, all of Minn.

[73] Assignee: Ault, Inc., Minneapolis, Minn.

[21] Appl. No.: 668,069

[22] Filed: Mar. 18, 1976

[51] Int. Cl.² ............................................. H05K 7/20
[52] U.S. Cl. ..................................... 361/388; 323/60; 336/160
[58] Field of Search ............... 310/47, 50; 174/52 PE, 174/16 R; 323/60 LD; 307/150; 317/99, 100, 101 R, 120; 336/61, 107, 160

[56] References Cited

U.S. PATENT DOCUMENTS

| | | | |
|---|---|---|---|
| 2,372,600 | 3/1945 | Newman | 323/60 |
| 2,800,625 | 7/1957 | Geroulo et al. | 323/60 |
| 3,387,244 | 6/1968 | Davis | 336/107 |
| 3,956,675 | 5/1976 | Bauer et al. | 317/100 |

Primary Examiner—Gerald P. Tolin
Attorney, Agent, or Firm—Schroeder, Siegfried, Ryan & Vidas

[57] ABSTRACT

A plug in power supply incorporating a ferro resonant transformer mounted on a pair of opposite "E" laminations to provide a low profile magnetic circuit and windings thereon combined with an electronic voltage regulator in which the regulation required therefrom because of the transformer regulation is relatively low and the electronic power component thereof will therefore not be required to dissipate a large amount of power. This enables packaging in a sealed container with a heat sink mounting the power transistor to uniformly distribute the heat thereon and provide a safe plug in power supply.

12 Claims, 4 Drawing Figures

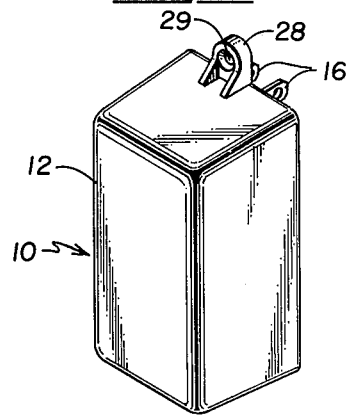
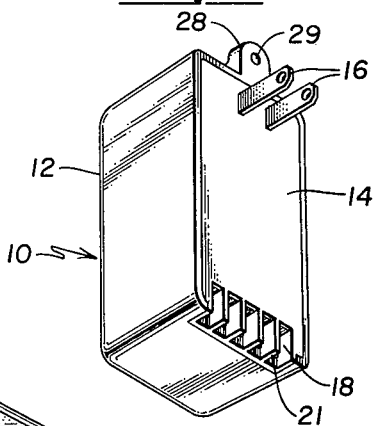
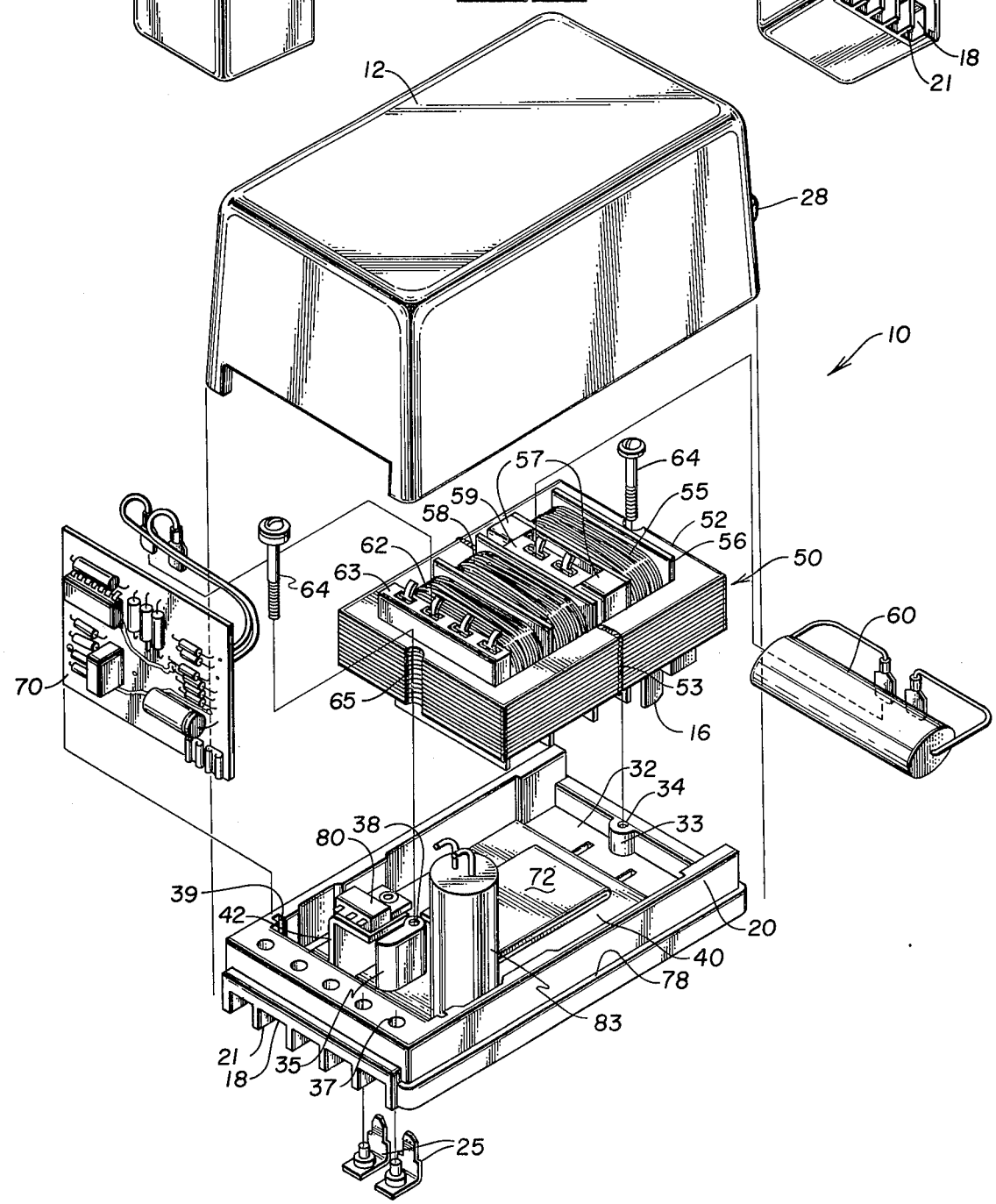

PLUG IN REGULATING POWER SUPPLY

My invention relates to a regulated power supply and more particularly to an improved regulated power supply of the plug in type positioned in a sealed thermoplastic housing to provide a non-hazardous design.

Regulating power supplies are well known and recognized in the art. Similarly, plug in units, such as transformers, have previously been used. Normally, regulating power supplies because of the high voltage aspects and heat generation are designed for use in isolated or protected areas and are normally not sealed to provide for venting or cooling of the same. Similarly, their size has normally restricted the application such that this could not be used as a plug in unit in an electrical outlet recepticle.

The present invention is directed to an improved regulated power supply of the plug in type which, because of its intended use in a location or accessible area or environment must be generally of a low profile and be packaged so that it will be non-hazardous as far as higher voltages are concerned. Similarly, in providing a non-hazardous package of the sealed type, the unit must not generate such quantities of internal heat as to develop hot spots on the surface to prevent the further hazard to personnel.

In the present invention, we have provided an improved plug in regulated power supply incorporating the combination of a voltage regulating transformer and an electronic voltage regulator in a single, compact, low profile package which is sealed to isolate any high voltage sources and which includes provisions for heat distribution therefrom to eliminate any hot spots on the surface thereon. The improved plug in regulating power supply includes the voltage regulating transformer and the electronic voltage regulator energized therefrom with the electronic voltage regulator having at least one power transistor capable of generating heat. The combination of the voltage regulator and regulating transformer are housed in a thermoplastic sealed container with a heat sink mounting the power transistor and extending along one surface thereof to distribute the heat generated thereby throughout the surface of the casing. The enclosure includes plug in terminals connected to the input of the transformer and output terminals, positioned in a shielded portion of the case such that the case when mounted provides no exposed terminal of hazardous high voltage and has a substantially uniform temperature and low profile to be mounted in a location or environment where, because of its construction, will create no hazardous condition for personnel.

Therefore, it is an object of this invention to provide an improved plug in type power supply.

Another object of this invention is to provide an improved regulating power supply incorporating a voltage regulating or ferro-resonant transformer and an electronic voltage regulator packaged in an enclosed mounting and adapted to be mounted on an electrical outlet recepticle so as to provide no exposed high voltage terminals.

Another object of this invention is to provide an improved plug in type power supply which has a low profile and is non-hazardous.

A still further object of this invention is to provide a regulating power supply which incorporates a uniform heat dissipator over one surface to prevent occurrance of hot spots thereon.

These and other objects of the invention will become apparent from the reading of the attached description together with the drawings wherein:

FIG. 1 is a pictorial view of the improved plug in regulating power supply from the front;

FIG. 2 is a pictorial view of the power supply from the rear;

FIG. 3 is a exploded view in perspective of the components of the improved plug in regulating power supply, and;

Figure 4:
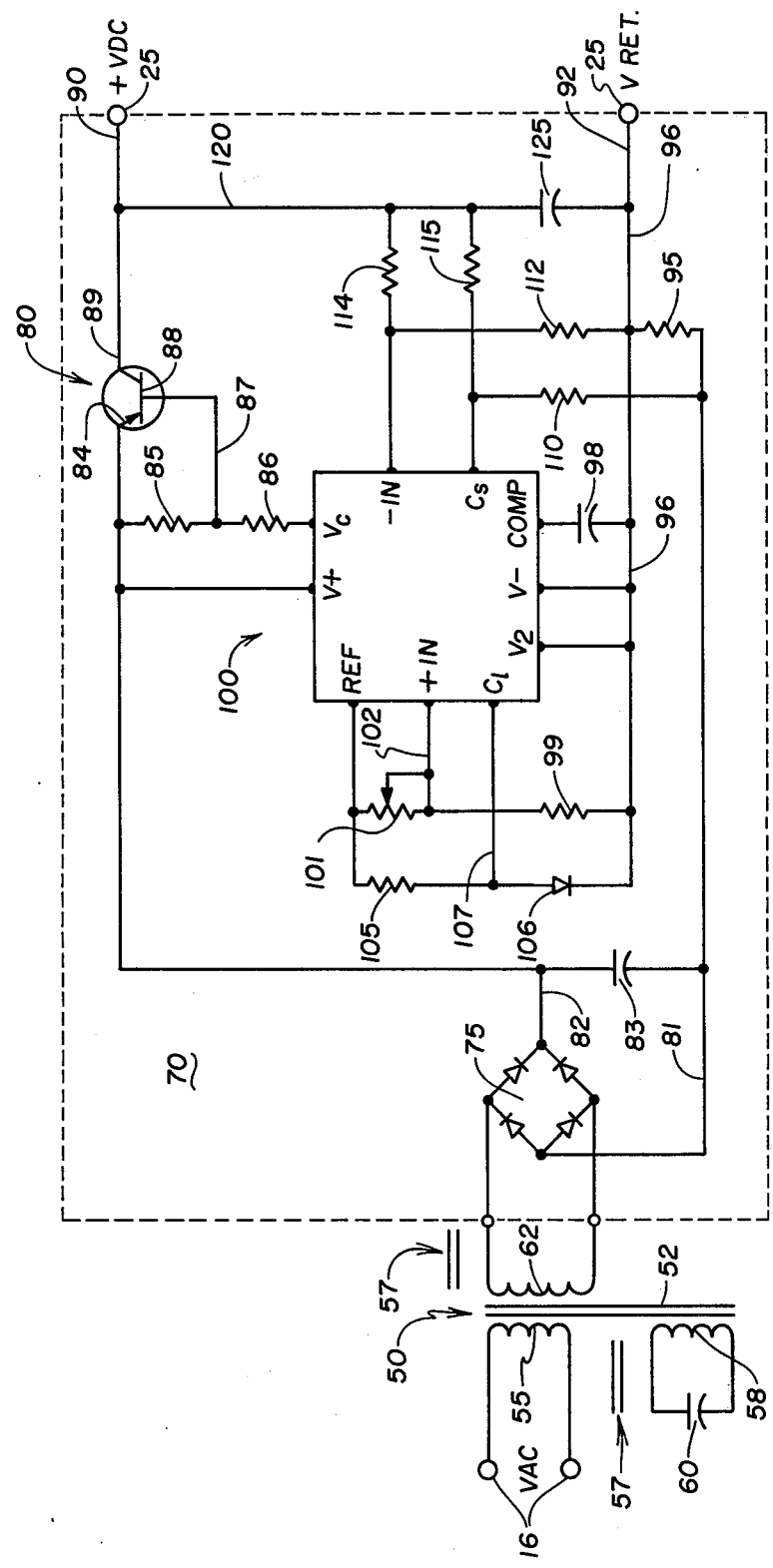
FIG. 4 is a circuit drawing of the same.

Our plug in power supply will be seen in FIGS. 1 and 2 as enclosed in a housing or container, indicated generally at 10, which container is formed of a cover part 12 and a base part 14. The parts are sealed together to form an enclosed housing made of a hard thermoplastic material and presenting a generally low profile or substantially thin housing which is generally rectangular in profile. The base part 14 has a pair of plug in terminals 16 projecting therefrom. The plug in terminals 16, as will be hereinafter seen, extend through the base member to the interior of the container for housing. The base member on the lower surface thereof is flat and at the end opposite the plug in terminals includes a plurality of recessed surfaces 18 divided by flange members 21 in which recesses are positioned respectively terminal connectors 25. The connectors are positioned in the recesses against the base such that electrical connections may be made thereto and the terminals do not project to the base surface or beyond the end of the base member. At the plug in terminal end, the cover member has a flange 28 formed integral therewith which flange has an aperture 29 therethrough, through which a suitable screw member (not shown) may be inserted to secure the housing of the power supply to an electrical outlet with the terminals 16 positioned in the recepticle portion of the same.

Internally the base 14 has a centrally located recessed surface 32 defined by a upstanding flanged surface 20 with hub portion 33 near the plug in terminal end of the same having an aperture 34 therein and with a centrally located post or raised flange member 35 with an aperture 38 therein positioned within the recess 32 and extending upwardly therein. Near the opposite end of the recess, the sides are grooved as at 39 for the purpose of mounting a circuit board, to be later identified, on end within the recess. Adjacent this end of the recess and in the raised flange portion 20 thereof, a plurality of apertures 37 through which the terminal connectors 25 extend for the purpose of securing the same to the band member and making electrical connections from the circuit board thereto for the output of the power supply.

Positioned on the exposed surface of the base within the recess area 32 is a flat heat sink member 40 which substantially fills the recessed area and has an L shaped flange 42 formed integral therewith and extending upwardly therefrom around the post section 35. A suitable mounting rivet (not shown) extends therethrough to secure the flat heat sink member, which is made of a metallic material such as aluminum, within the base. As will be hereinafter noted, the heat sink 40 or heat dissipator provides for uniform distribution of the heat from the electronic component of the voltage regulator to be hereinafter identified throughout the base member to eliminate hot spots thereon.

Positioned within the base member and secured thereto is a voltage regulating transformer 50 which transformer is formed of stacks of core members of opposed double "E" laminations 52 which abut one another and are welded at the junction of the legs, as at 53. This arrangement provides a relatively thin stack of laminations with a relatively wide window opening for windings and a magnet circuit sufficient to carry the magnetic flux with the transformer. Positioned within the window opening and assembled on the laminations before they are abutted and welded is a first winding 55 mounted on a bobbin 56 identified as a primary winding 55 having electrical connections extending therefrom and to the exposed ends of the plug in terminals 16 within the base member. Also positioned on the center leg of the double E transformer core is a saturating winding 58 also mounted on a bobbin and with suitable electrical connectors 59 therefrom which are connected a capacitor 60. A secondary or output winding 62 on a mounting bobbin is also positioned on the center leg and has output terminals 63 extending therefrom by means of which electrical connections are made to an electronic voltage regulator, indicated generally at 70. Magnetic bridging shunt members 57 are positioned between the outer and center legs of the E shaped core members and separate the primary windings 55 from the saturating and secondary windings 58 and 62. The ends of the E shaped core members are notched as at 65 and suitable self-tapping mounting bolts 64 extend through the flange 33 and into the aperture 34 therein at one end of the base member and through the upstanding post of flange 35 into the aperture 38 therein to secure the assembled transformer to the base member. A layer of insulating paper 72 is positioned on the base member above the heat sink and between the transformer windings and/or bobbins and the heat sink to insulate and space the transformer windings from the heat sink.

Positioned adjacent the circuit board which is mounted on end in the slot 39 in the base is a capacitor 83 which is located adjacent the post 35 mounting the end of the heat sink. Mounted on this flange end 42 of the heat sink is a transistor component, power transistor 80 for the electronic voltage regulator 70, the circuit board of which is mounted in slots 39. As will be hereinafter noted, the secondary winding is connected through a full wave rectifier and from the output terminals therefrom to the circuit components on the circuit board with the output of the circuit board being connected to the terminals 25 positioned through the apertures 37 in the base member.

The cover or top part 12 of the container or housing has a deep recess therein to enclose and cover the transformer and the circuit board with the transistor and capacitors which are secured to the base and to fit around the ridge 78 in the outer edge of the flanged portion 20 of the base to completely enclose the same. Suitable adhesive material or an ultrasonic weld (not shown) affects a coupling of the housing parts together to form a sealed unit defining a thermoplastic enclosure.

The circuit for the transformer and electronic voltage regulator is shown in FIG. 4 with the transformer being a conventional ferro resonant transformer having its primary winding 55 connected to the terminals 16 for plug in to an alternating current source of power of a conventional line voltage of 117 volts at 60 cycles. The saturating winding 58 is directly connected to the capacitor 60 is a closed electric circuit therewith. The seconary winding 62 is connected to the full wave rectifier 75 having output terminals 81, 82, leading to the circuit board of the electronic voltage regulator. A suitable filtering capacitor 83 is connected across the output secondary of the same. Conductor 82 of this output of the rectifier or the plus side of the same is connected to the transistor 80 at the emitter terminal 84 of the same with this conductor also being connected to a $V\pm$ of a voltage regulator chip indicated generally at 100. This chip is identified as a $=A723C$, or an integrated circuit voltage regulator of the type manufacture by Fairchild Instrument. Conductors 82 is also connected through resistors 85, 86 in series of the Vc terminal of the electronic voltage regulator chip identified above with the midpoint of the resistors being connected through a conductor 87 through the base 88 of the transistor. The collector 89 of the transistor 80 is connected to the output conductor 90 of the regulator and to one of the terminals 25. Conductor 81 is connected through a voltage dropping resistor 95 or current sense resistor to an output bus 96 common with an output conductor 92 and a terminal 25. The bus 96 is connected through a capacitor 98 to the compensating terminals COMP of the regulator with the V- and V2 terminals being directly connected to the bus 96. A resistor 99 in series with an adjustable resistor 101 is connected to the voltage reference terminal REF of the regulator with the wiper of the adjustable resistor and the other end of the same being connected through a conductor 102 to $\pm$ in terminal of the regulator. A suitable resistor 105 and diode 106 in series are connected in parallel with resistors 99 and 101 with the midpoint between the resistor and diode being connected through a conductor 107 to the current limit $C_L$ terminal of the regulator. The input conductor 81 is also connected through a resistor 110 to the current sensor $C_s$ terminal of the regulator with an - in terminal being connected through a resistor 112 to the conductor 96. Suitable bias resistors 114 and 115 are connected respectively to the -in and current sencor $C_s$ terminals respectively and in common to a conductor 120 leading to the output conductor 90 and the collector 89 of the transistor 80 with a capacitor 125 being connected between the conductor 120 and the conductor 96. The electronic voltage regulator circuit is a conventional unit and the input circuits thereto are conventional with the operation of this integrated circuit voltage regulator identified above. Similarly, the voltge regulating transformer is basically a conventional ferro resonant transformer except for the use of the double E laminations to provide a low profile magnetic circuit with a large window opening such that the windings and bobbins may be made relatively thin to provide a thin profile package.

In this improved voltage regulating power supply, the use of a transformer voltage regulator of the ferro resonant type reduces the loading on the electronic voltage regulator such that the power component of the same will not be required to dissipate a significant amount of power and hence, not generate a large quantity of heat. The mounting of this power transistor on a heat sink which is positioned on and distributed throughout the recess in the base of the housing and is separated from the voltage regulating transformer provides for a uniform distribution of the heat from the power transistor so that hot spots will not develop within the enclosed and sealed power supply housing. The heat generated thereby will be dissipated over a large surface of the base of the housing and remote from an area which might be contacted by personnel so as to remove any hazard of hot spots exposed to personnel. Similarly, the enclosed housing isolates any high voltage terminals of the unit when it is mounted in a plug in recepticle and a uniform distribution of heat therefrom across the base of the unit will be dissipated throughout the housing. The low voltage output terminals are shielded within the base of the housing so that electrical connections may be made thereto but the terminals will not be exposed to create any hazard. In addition, the housing includes a flange by means of which the power supply may be additionally secured on the surface of the electrical outlet through a suitable screw positioned through an aperture in the flange on the cover to positively secure the power supply thereon and prevent the same from being dislodged by contact thereto. This improved voltage regulating power supply meets safety standards and is packaged in a low profile package which may be attractively housed for use in an exposed location where it is apt to be contacted by personnel. The improved packaging eliminates hot spots on any accessible surface and provides a tamper-proof and fail-safe unit which will deliver a regulated power, either DC or AC, depending upon the circuitry therein. The unit, while employing a standard transformer and a standard electronic voltage regulator, is packaged in such a manner that it will be safe to use and will present no hazard for operation in relatively accessible area such as a plug in outlet.

Therefore, in considering this invention, it should be remembered that this disclosure is illustrative and the scope of the invention should be determined by the appended claims.

What we claim is:

1. A plug in voltage regulating power supply comprising, a transformer having an input and output winding with a pair of plug in terminals connected to the input winding, an electronic voltage regulator connected to the output winding of the transformer and energized thereby adapted to produce a regulated output voltage, said voltage regulator having at least one electronic element generating significant heat, a thermoplastic enclosure mounting said transformer and said voltage regulator and enclosing the same with said plug in terminals of said transformer extending therethrough; and a heat sink mounting said heat generating electronic element apart from said transformer and said voltage regulator and positioned within the thermoplastic enclosure and against one surface thereof to distribute the heat generated by said electronic element throughout said surface of said enclosure.

2. The plug in regulating power supply of claim 1 in which the transformer is the step down voltage regulating transformer producing a low voltage output therefrom.

3.. The plug in regulating power supply of claim 2 in which said transformer includes a core structure formed of a pair of opposed double E type core members providing a large window opening for the input and output windings and a saturating winding to be distributed thereon and, defining a low thickness profile enclosed in said enclosure.

4. The plug in regulating power supply of claim 1 in which the electronic element of the electronic voltage regulator is a single power transistor providing from the regulated power supply a regulated DC low voltage output.

5. The plug in regulating power supply of claim 3 in which the thermoplastic enclosure is a sealed unit enclosing a transformer and electronic voltage regulator providing passage therethrough for the plug in terminals of the transformer and output terminals from the voltage regulator.

6. The plug in requlating power supply of claim 5 in which the thermoplastic enclosure includes a flange projection having an aperture therethrough located adjacent that portion of the enclosure through which the plug in terminals extend and adapted to receive a mounting screw to secure the plug in regulating power supply on an electrical recepticle.

7. The plug in regulating power supply of claim 6 in which the output terminals of the voltage regulator extending through the sealed container are housed in recessed flanged sections insulating the terminals from one another and shielding them from exposure on the enclosure.

8. The plug in regulating power supply of claim 3 and including insulator means positioned between the heat sink and the windings of the transformer.

9. The plug in regulating power supply of claim 1 in which the enclosure includes a base part and the cover part with a base part having an upstanding flange defining a recess therein and with mounting posts positioned on the base part projecting from the recess and mounting said transformer core structure and said heat sink which is positioned in the recess of the base part.

10. The plug in regulating power supply of claim 9 in which the heat sink includes a flat plate portion positioned in the recess of the base part with an upstanding flange member connected to one of the upstanding posts in the base part and in which the heat generating electronic element is positioned on the upstanding flange member of the heat sink.

11. The plug in regulating power supply of claim 10 in which the electronic voltage regulator includes a circuit board mounted in grooved notches on edge in the recess of the base member.

12. The plug in regulating power supply of claim 11 and including bridging shunt means positioned between the legs of the "E" shaped lamination and the center leg and separating the input winding from the output and saturating windings.

* * * * *

UNITED STATES PATENT AND TRADEMARK OFFICE
CERTIFICATE OF CORRECTION

PATENT NO. : 4,039,900
DATED : August 2, 1977
INVENTOR(S) : Donald W. Roback et al It is certified that error appears in the above-identified patent and that said Letters Patent are hereby corrected as shown below:

Column 3, line 68, delete "seconary" and insert — secondary —

Column 4, line 8, delete "V$\pm$" and insert — V+ —

Column 4, line 29, delete "$\pm$" and insert = + —

Column 4, line 47, delete "voltge" and insert — voltage —

Signed and Sealed this

*Eighteenth* Day of *October 1977*

[SEAL]

*Attest:*

RUTH C. MASON
*Attesting Officer*

LUTRELLE F. PARKER
*Acting Commissioner of Patents and Trademarks*